(12) United States Patent
Tu et al.

(10) Patent No.: US 10,782,808 B2
(45) Date of Patent: Sep. 22, 2020

(54) SHIFT REGISTER AND TOUCH DISPLAY APPARATUS THEREOF

(71) Applicant: Au Optronics Corporation, Hsinchu (TW)

(72) Inventors: Chun-Da Tu, Hsinchu (TW); Ming-Hsien Lee, Hsinchu (TW); Kai-Wei Hong, Taichung (TW); Chuang-Cheng Yang, Changhua County (TW); Yi-Cheng Lin, New Taipei (TW); Chun-Feng Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 188 days.

(21) Appl. No.: 16/008,039

(22) Filed: Jun. 14, 2018

(65) Prior Publication Data

US 2019/0064978 A1 Feb. 28, 2019

(30) Foreign Application Priority Data

Aug. 25, 2017 (TW) .............................. 106129050 A

(51) Int. Cl.
  *G06F 3/041* (2006.01)
  *G09G 3/20* (2006.01)
  *G11C 19/28* (2006.01)

(52) U.S. Cl.
  CPC .......... *G06F 3/0412* (2013.01); *G06F 3/0416* (2013.01); *G09G 3/20* (2013.01); *G11C 19/28* (2013.01); *G09G 2310/0286* (2013.01)

(58) Field of Classification Search
  None
  See application file for complete search history.

(56) References Cited

U.S. PATENT DOCUMENTS 9,620,078 B2 4/2017 Hong et al.
9,933,889 B2 4/2018 Xiao et al.
(Continued)

FOREIGN PATENT DOCUMENTS

CN   104123903   10/2014
CN   104409102   3/2015
(Continued)

OTHER PUBLICATIONS

"Office Action of China Counterpart Application", dated Mar. 31, 2020, p. 1-p. 10.

*Primary Examiner* — Amare Mengistu
*Assistant Examiner* — Sarvesh J Nadkarni
(74) *Attorney, Agent, or Firm* — JCIPRNET

(57) ABSTRACT

A shift register and a touch display apparatus thereof are provided. The shift register includes a voltage setting unit, a driving unit, a control unit, a discharge unit, a first compensation transistor, and a second compensation transistor. The voltage setting unit sets a terminal voltage of an internal terminal. The driving unit is coupled to the internal terminal to provide a gate signal and a driving signal. The control unit receives the terminal voltage to provide a control signal. The discharge unit discharges the terminal voltage and the gate signal according to the control signal. The first compensation transistor and the second compensation transistor are coupled in series between a touch enable signal and the internal terminal, and control terminals of the first compensation transistor and the second compensation transistor receive the terminal voltage and the touch enable signal, respectively.

10 Claims, 4 Drawing Sheets

(56) References Cited

U.S. PATENT DOCUMENTS

| | | | |
|---|---|---|---|
| 10,222,904 B2 | 3/2019 | Gu et al. | |
| 2016/0266699 A1* | 9/2016 | Zhao | G11C 19/287 |
| 2016/0365061 A1 | 12/2016 | Hong et al. | |
| 2017/0123556 A1* | 5/2017 | Lin | G06F 3/0412 |
| 2017/0124971 A1 | 5/2017 | Tu et al. | |
| 2017/0178584 A1* | 6/2017 | Ma | G09G 3/3677 |
| 2017/0186352 A1 | 6/2017 | Lin et al. | |
| 2017/0193943 A1* | 7/2017 | Cao | G09G 3/3677 |
| 2017/0269769 A1* | 9/2017 | Hu | G09G 3/20 |
| 2018/0046308 A1* | 2/2018 | Xiao | G06F 3/0416 |
| 2018/0046311 A1* | 2/2018 | Gu | G11C 19/28 |

FOREIGN PATENT DOCUMENTS

| | | |
|---|---|---|
| CN | 105068682 | 11/2015 |
| CN | 105513550 | 4/2016 |
| CN | 105679262 | 6/2016 |
| CN | 105786250 | 7/2016 |
| CN | 106297888 | 1/2017 |

* cited by examiner

… (1) …

SHIFT REGISTER AND TOUCH DISPLAY APPARATUS THEREOF

CROSS-REFERENCE TO RELATED APPLICATION

This application claims the priority benefit of Taiwan application Ser. No. 106129050, filed on Aug. 25, 2017. The entirety of the above-mentioned patent Applications is hereby incorporated by reference herein and made a part of this specification.

BACKGROUND OF THE INVENTION

Field of the Invention

The invention relates to a shift register, and in particular, to a shift register and a touch display apparatus thereof.

Description of Related Art

To meet the demands for light, thinness and high operational sensitivity in electronic apparatuses, the in-cell touch panel has become one of the major products in touch applications. Specifically, in an in-cell touch panel, touching and display are time-dividing driven, and during touch scanning, a state of a shift register providing a gate signal will remain unchanged firstly. However, as electrical charges in the in-cell touch panel are easily lost, if the state of the shift register is maintained for an extended period of time, operation errors arise and cause the display of the in-cell touch panel to fail to operate normally. Accordingly, how to maintain the state of the shift register in a desirable manner during touch scanning is one of the essential issues in designing the shift register.

SUMMARY OF THE INVENTION

The embodiment of the invention provides a shift register and a touch display apparatus thereof that charge an internal terminal of the shift register during touch scanning to prevent failure of normal operation of the shift register.

In the embodiment of the invention, the shift register includes a voltage setting unit, a driving unit, a first control unit, a discharge unit, a first compensation transistor, and a second compensation transistor. The voltage setting unit receives a first gate reference signal to set a terminal voltage of an internal terminal. The driving unit is coupled to the internal terminal, and the driving unit receives the terminal voltage and a clock signal to provide a gate signal and a driving signal. The first control unit is coupled to the internal terminal and receives a first low-frequency clock signal, the terminal voltage, and a low voltage to provide a first control signal. The discharge unit is coupled to the first control unit to receive the first control signal and discharges the terminal voltage and the gate signal according to the first control signal. The first compensation transistor includes a first terminal, a control terminal, and a second terminal, wherein the first terminal receives a touch enable signal, and the control terminal is coupled to the internal terminal. The second compensation transistor includes a first terminal, a control terminal, and a second terminal, wherein the first terminal is coupled to the second terminal of the first compensation transistor, the control terminal receives the touch enable signal, and the second terminal is coupled to the internal terminal.

In the embodiment of the of the invention, the touch display apparatus includes a display panel, a touch layer, and a multiple stages of the shift register. The display panel includes an active region and a peripheral region. The touch layer is located in the active region. The multiple stages of the shift register is located in the peripheral region and is coupled to the display panel, wherein each stage of the shift register receives a touch enable signal and a first clock signal and outputs a current stage of the gate signal and a current stage of the driving signal. The each stage of the shift register further includes a voltage setting unit, a driving unit, a first control unit, a discharge unit, a first compensation transistor, and a second compensation transistor. The voltage setting unit is respectively coupled to a previous two stages of the gate signal and a previous two stage of the driving signal. The driving unit is coupled to the first clock signal and outputs the current stage of the gate signal and the current stage of the driving signal, wherein the voltage setting unit and the driving unit are coupled to each other via an internal terminal. The control unit is coupled to the internal terminal and outputs a control signal. The discharge unit is respectively coupled to the internal terminal, the control unit, and the driving unit and receives the control signal. The first compensation transistor includes a first terminal, a control terminal, and a second terminal, wherein the first terminal is coupled to the touch enable signal, and the control terminal is coupled to the internal terminal. The second compensation transistor includes a first terminal, a control terminal, and a second terminal, wherein the first terminal is coupled to the second terminal of the first compensation transistor, the control terminal is coupled to the touch enable signal, and the second terminal is coupled to the internal terminal.

To provide a further understanding of the aforementioned and other features and advantages of the disclosure, exemplary embodiments, together with the reference drawings, are described in detail below.

DESCRIPTION OF THE EMBODIMENTS

Figure 1:
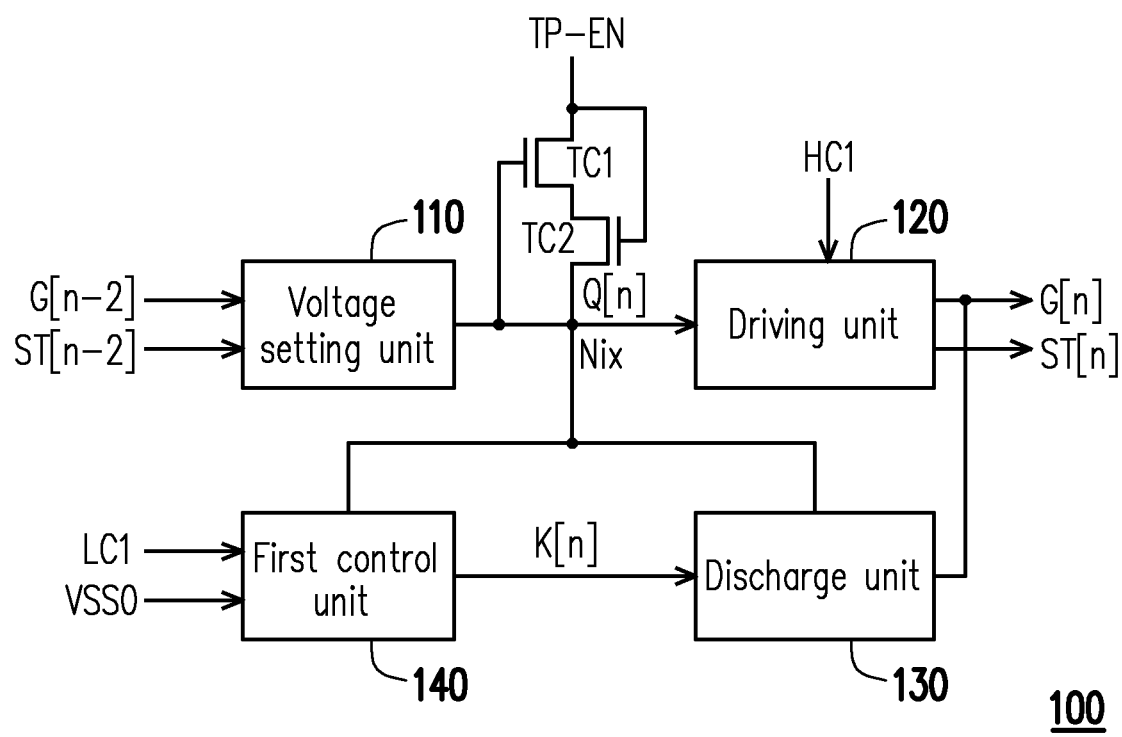
FIG. 1 is a schematic diagram illustrating a system of a shift register according to an embodiment of the invention.

FIG. 1 is a schematic diagram illustrating a system of a shift register according to an embodiment of the invention. Referring to FIG. 1, the embodiment, a shift register 100 includes a voltage setting unit 110, a driving unit 120, a discharge unit 130, a first control unit 140, a first compensation transistor TC1, and a second compensation transistor TC2. The voltage setting unit 110 and the driving unit 120 are coupled to each other via an internal terminal Nix.

The voltage setting unit 110 receives a previous two stages of the gate signal G[n−2] (corresponding to a first gate reference signal) and a previous two stages of the driving signal ST[n−2] to set a terminal voltage Q[n] of the internal terminal Nix, wherein n is a positive integer. The driving unit 120 is coupled to the internal terminal Nix, and the driving unit 120 receives the terminal voltage Q[n] and a clock signal HC1 to provide a the current stage of the gate signal G[n] and a the current stage of the driving signal ST[n]. The voltage setting unit 110 and the driving unit 120 are coupled to each other via the internal terminal Nix.

The first control unit 140 is coupled to the internal terminal Nix and receives a first low-frequency clock signal LC1, the terminal voltage Q[n], and a first low voltage VSS0 to provide a first control signal K[n]. The discharge unit 130 is coupled to the first control unit 140 to receive the first control signal K[n] and is coupled to the internal terminal Nix and the driving unit 120 to discharge the terminal voltage Q[n] and the current stage of the gate signal G[n] according to the first control signal K[n].

A first terminal of the first compensation transistor TC1 receives a touch enable signal TP_EN, and a control terminal of the first compensation transistor TC1 is coupled to the internal terminal Nix. A first terminal of the second compensation transistor TC2 is coupled to a second terminal of the first compensation transistor TC1, a control terminal of the second compensation transistor TC2 receives the touch enable signal TP_EN, and a second terminal of the second compensation transistor TC2 is coupled to the internal terminal Nix.

According to the above, when a touch display panel is scanning, the touch enable signal TP_EN is enabled (being high-level, for example). Moreover, when the shift register 100 is started, the terminal voltage Q[n] will be high-level. At this time, the first compensation transistor TC1 and the second compensation transistor TC2 are both switched on, and the enabled touch enable signal TP_EN passes the switched-on first compensation transistor TC1 and second compensation transistor TC2 to charge the terminal voltage Q[n], which prevents decay of the terminal voltage Q[n] resulting from passing of time and further prevents failure of normal operation.

In the foregoing embodiment, the voltage setting unit 110 simultaneously receives the previous two stage of gate signal G[n−2] and the previous two stage of the driving signal ST[n−2]. However, in some embodiments, the voltage setting unit 110 receives one of the previous two stage of the gate signal G[n−2] and the previous two stage of the driving signal ST[n−2], which is determined according to the circuit design and does not limit the present embodiment of the invention.

Figure 2:
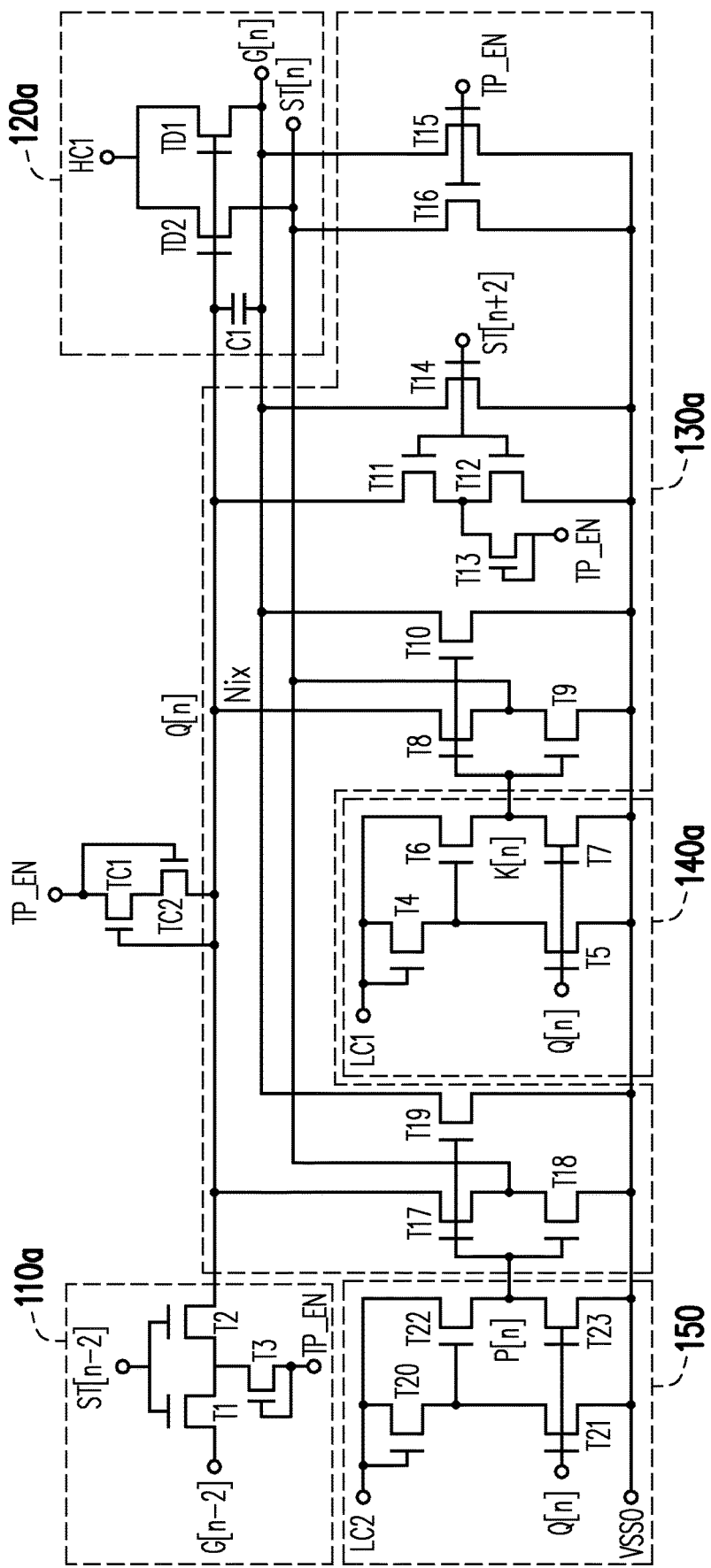
FIG. 2 is a schematic diagram illustrating a circuit of a shift register according to an embodiment of the invention.

FIG. 2 is a schematic diagram illustrating a circuit of a shift register according to an embodiment of the invention. Referring to FIG. 1 and FIG. 2, in the present embodiment, a shift register 200 includes a voltage setting unit 110a, a driving unit 120a, a discharge unit 130a, a first control unit 140a, a second control unit 150, a first compensation transistor TC1, and a second compensation transistor TC2, wherein the same or similar components are labeled by the same or similar numerals. The second control unit 150 is coupled to the internal terminal Nix and receives a second low-frequency clock signal LC2, the terminal voltage Q[n], and the first low voltage VSS0 to provide a second control signal P[n]. In the present embodiment, the second low-frequency clock signal LC2 is an inverted signal of the first low-frequency clock signal LC1. For example, when the first low-frequency clock signal LC1 is high-level, the second low-frequency clock signal LC2 is low-level; when the first low-frequency clock signal LC1 is low-level, the second low-frequency clock signal LC2 is high-level.

In the embodiment of FIG. 2, the voltage setting unit 110a includes transistors T1 to T3 (corresponding to a first transistor to a third transistor). A first terminal of the transistor T1 is coupled to the previous two stage of the gate signal G[n−2], and a control terminal of the transistor T1 is coupled to the previous two stage of the driving signal ST[n−2]. A first terminal of the transistor T2 is coupled to a second terminal of the transistor T1, a control terminal of the transistor T2 receives the previous two stage of the driving signal ST[n−2], and a second terminal of the transistor T2 is coupled to the internal terminal Nix. A first terminal of the transistor T3 is coupled to the second terminal of the transistor T1, and a second terminal and a control terminal of the transistor T3 are respectively coupled to the touch enable signal TP_EN.

When the previous two stage of the driving signal ST[n−2] and the previous two stage of the gate signal G[n−2] are high-level, the transistors T1 and T2 are simultaneously switched on, and previous two stage of the gate signal G[n−2] with high-level is charging the internal terminal Nix, namely, raising the terminal voltage Q[n]. When the previous two stage of the driving signal ST[n−2] and the previous two stage of the gate signal G[n−2] are low-level, the transistors T1 and T2 are simultaneously cut off (not switched on), and a state of the terminal voltage Q[n] is irrelevant to the level of the previous two stage of the gate signal G[n−2]. Moreover, when the touch enable signal TP_EN is high-level, a voltage at the connection point of the transistors T1 and T2 is raised to suppress a leakage current passing the transistors T1 and T2.

In the embodiment of FIG. 2, the driving unit 120a includes drive transistors TD1 to TD2 (corresponding to a first drive transistor and a second drive transistor) and a capacitor C1. A first terminal of the drive transistor TD1 receives the clock signal HC1, a control terminal of the drive transistor TD1 receives the terminal voltage Q[n], and a second terminal of the drive transistor TD1 provides the current stage of the gate signal G[n]. A first terminal of the drive transistor TD2 receives the clock signal HC1, a control terminal of the drive transistor TD2 receives the terminal voltage Q[n], and a second terminal of the drive transistor TD2 provides the current stage of the driving signal ST[n]. The capacitor C1 is coupled between the control terminal and the second terminal of the drive transistor TD1.

When the terminal voltage Q[n] is high-level, the drive transistors TD1 and TD2 are simultaneously switched on to respectively output the clock signal HC1 and form the current stage of the gate signal G[n] and the current stage of the driving signal ST[n]. When the terminal voltage Q[n] is low-level, the drive transistors TD1 and TD2 are simultaneously cut off (not switched on), and at this time, the levels of the current stage of the gate signal G[n] and the current stage of the driving signal ST[n] are irrelevant to the clock signal HC1.

In the embodiment of FIG. 2, the first control unit 140a includes transistors T4 to T7. A first terminal of the transistor T4 receives the first low-frequency clock signal LC1, and a control terminal of the transistor T4 is coupled to the first terminal of the transistor T4. In other words, the first terminal and the control terminal of the transistor T4 respectively receive the first low-frequency clock signal LC1. A first terminal of the transistor T5 is coupled to a second terminal of the transistor T4, a control terminal of the transistor T5 receives the terminal voltage Q[n], and a second terminal of the transistor T5 receives the first low voltage VSS0. A first terminal of the transistor T6 receives the first low-frequency clock signal LC1, a control terminal of the transistor T6 is coupled to the second terminal of the transistor T4, and a second terminal of the transistor T6 provides the first control signal K[n]. A first terminal of the transistor T7 is coupled to the second terminal of the transistor T6, a control terminal of the transistor T7 receives the terminal voltage Q[n], and a second terminal of the transistor T7 receives the first low voltage VSS0.

In the present embodiment, the second control unit 150 includes transistors T20 to T23. A first terminal of the transistor T20 receives the second low-frequency clock signal LC2, and a control terminal of the transistor T20 is coupled to the first terminal of the transistor T20. A first terminal of the transistor T21 is coupled to a second terminal of the transistor T20, a control terminal of the transistor T21 receives the terminal voltage Q[n], and a second terminal of the transistor T21 receives the first low voltage VSS0. A first terminal of the transistor T22 receives the second low-frequency clock signal LC2, a control terminal of the transistor T22 is coupled to the second terminal of the transistor T20, and a second terminal of the transistor T22 provides the second control signal P[n]. A first terminal of the transistor T23 is coupled to the second terminal of the transistor T22, a control terminal of the transistor T23 receives the terminal voltage Q[n], and a second terminal of the transistor T23 receives the first low voltage VSS0.

Operation of the second control unit 150 is largely identical to operation of the first control unit 140a and differs by alternate driving through the first low-frequency clock signal LC1 and the second low-frequency clock signal LC2. In other words, the first control signal K[n] and the second control signal P[n] are alternately high-level.

In the embodiment of FIG. 2, the discharge unit 130a includes transistors T8 to T19. A first terminal of the transistor T8 (corresponding to a fourth transistor) is coupled to the internal terminal Nix, a control terminal of the transistor T8 receives the first control signal K[n], and a second terminal of the transistor T8 is coupled to the current stage of the driving signal ST[n]. A first terminal of the transistor T9 (corresponding to a fifth transistor) is coupled to the current stage of the driving signal ST[n], a control terminal of the transistor T9 receives the first control signal K[n], and a second terminal of the transistor T9 receives the first low voltage VSS0. A first terminal of the transistor T10 (corresponding to a sixth transistor) is coupled to the gate signal G[n] of the current stage, a control terminal of the transistor T10 receives the first control signal K[n], and a second terminal of the transistor T10 receives the first low voltage VSS0.

When the first control signal K[n] is high-level, the transistors T8 to T10 are simultaneously switched on to lower the terminal voltage Q[n] and the current stage of the gate signal G[n] by the first low voltage VSS0. When the first control signal K[n] is low-level, the transistors T8 to T10 are simultaneously cut off (not switched on), and at this time, the levels of the terminal voltage Q[n] and the current stage of the gate signal G[n] are irrelevant to the first low voltage VSS0.

A first terminal of the transistor T11 (corresponding to a seventh transistor) is coupled to the internal terminal Nix, and a control terminal of the transistor T11 receives a next two stages of driving signal ST[n+2] (corresponding to a second driving reference signal). A first terminal of the transistor T12 (corresponding to an eighth transistor) receives a second terminal of the transistor T11, a control terminal of the transistor T12 receives the next two stages of the driving signal ST[n+2], and a second terminal of the transistor T12 receives the first low voltage VSS0. A first terminal of the transistor T13 (corresponding to a ninth transistor) is coupled to the second terminal of the transistor T11, and a control terminal and a second terminal of the transistor T13 receive the touch enable signal TP_EN. A first terminal of the transistor T14 (corresponding to a tenth transistor) receives the current stage of the gate signal G[n], a control terminal of the transistor T14 receives the next two stages of the driving signal ST[n+2], and a second terminal of the transistor T14 receives the first low voltage VSS0.

When the next two stages of the driving signal ST[n+2] is high-level, the transistors T11, T12, and T14 are simultaneously switched on to lower the terminal voltage Q[n] and the current stage of the gate signal G[n] by the first low voltage VSS0. When the next stages of the driving signal ST[n+2] is low-level, the transistors T11, T12, and T14 are simultaneously cut off (not switched on), and at this time, the levels of the terminal voltage Q[n] and the current stage of the gate signal G[n] are irrelevant to the first low voltage VSS0. Moreover, when the touch enable signal TP_EN is high-level, a voltage at the connection point of the transistors T11 and T12 is raised to suppress a leakage current passing the transistors T11 and T12.

A first terminal of the transistor T15 (corresponding to an eleventh transistor) receives the current stage of the gate signal G[n], a control terminal of the transistor T15 receives the touch enable signal TP_EN, and a second terminal of the transistor T15 receives the first low voltage VSS0. A first terminal of the transistor T16 (corresponding to a twelfth transistor) receives the current stage of the driving signal ST[n], a control terminal of the transistor T16 receives the touch enable signal TP_EN, and a second terminal of the transistor T16 receives the first low voltage VSS0.

When the touch enable signal TP_EN is high-level, the transistors T15 and T16 are simultaneously switched on to lower the current stage of the gate signal G[n] and the current stage of the driving signal ST[n] by the first low voltage VSS0. When the touch enable signal TP_EN is low-level, the transistors T15 and T16 are simultaneously cut off (not switched on), and at this time, the levels of the current stage of the gate signal G[n] and the current stage of the driving signal ST[n] are irrelevant to the first low voltage VSS0.

A first terminal of the transistor T17 is coupled to the internal terminal Nix, a control terminal of the transistor T17 receives the second control signal P[n], and a second terminal of the transistor T17 is coupled to the driving signal ST[n] of the current stage. A first terminal of the transistor T18 receives the current stage of the driving signal ST[n], a control terminal of the transistor T18 receives the second control signal P[n], and a second terminal of the transistor T18 receives the first low voltage VSS0. A first terminal of the transistor T19 receives the gate signal G[n] of the current stage, a control terminal of the transistor T19 receives the second control signal P[n], and a second terminal of the transistor T19 receives the first low voltage VSS0.

When the second control signal P[n] is high-level, the transistors T17 to T19 are switched on to lower the terminal voltage Q[n] and the current stage of the gate signal G[n] by the first low voltage VSS0. When the second control signal P[n] is low-level, the transistors T17 to T19 are cut off (not switched on), and the levels of the terminal voltage Q[n] and the current stage of the gate signal G[n] are irrelevant to the first low voltage VSS0.

In the foregoing embodiment, the shift register 200 further includes the second control unit 150. However, in some embodiments, the second control unit 150 is omitted, and the transistors T17 to T19 are correspondingly omitted from the discharge unit 130a, which is determined according to the circuit design and does not limit the present embodiment of the invention.

Figure 3:
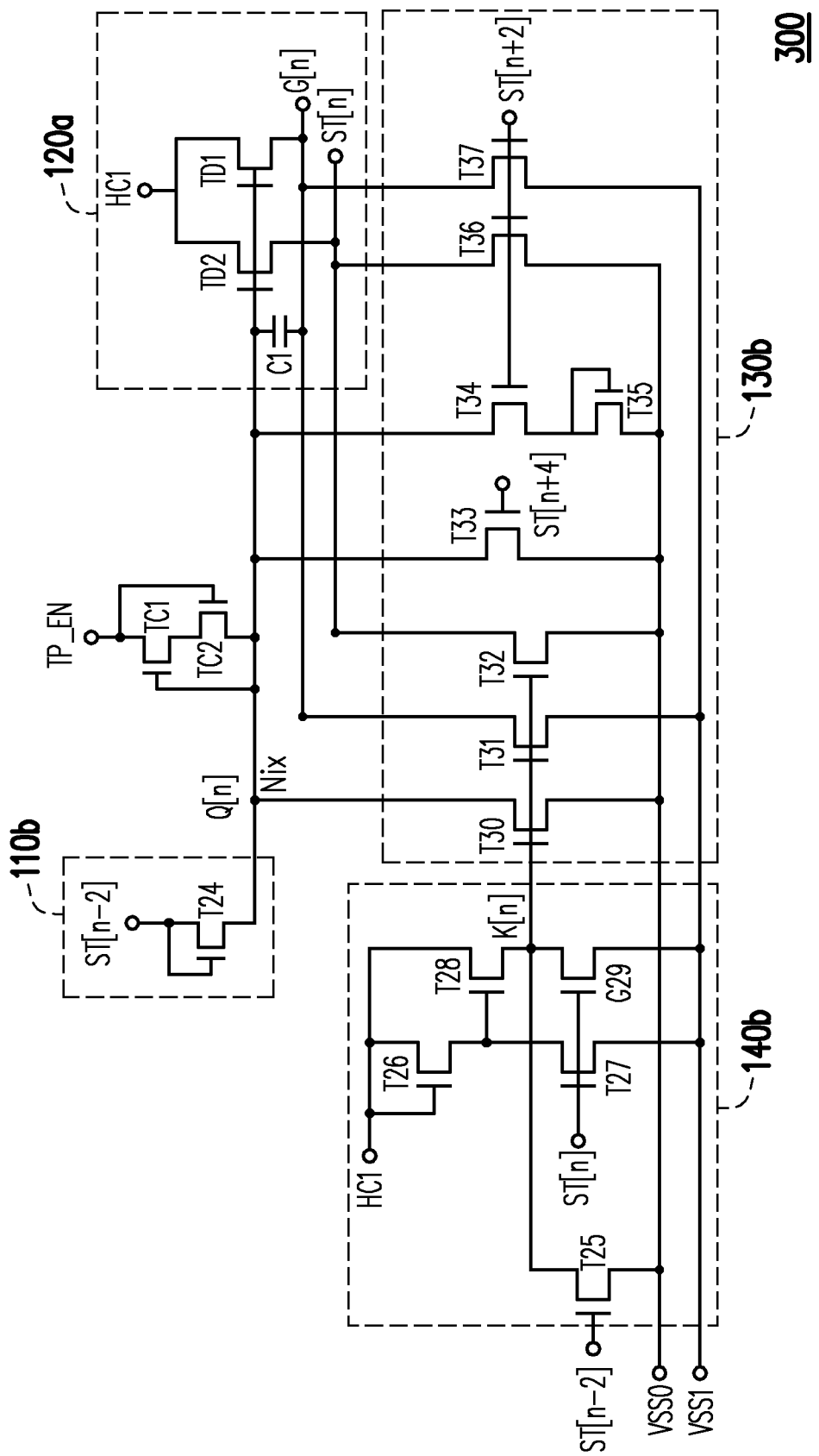
FIG. 3 is a schematic diagram illustrating a circuit of a shift register according to another embodiment of the invention.

FIG. 3 is a schematic diagram illustrating a circuit of a shift register according to another embodiment of the invention. Referring to FIG. 1 to FIG. 3, in the present embodiment, a shift register 300 includes a voltage setting unit 110b, a driving unit 120a, a discharge unit 130b, a first control unit 140b, a first compensation transistor TC1, and a second compensation transistor TC2, wherein the same or similar components are labeled by the same or similar numerals.

In the embodiment of FIG. 3, the voltage setting unit 110b of the shift register 300 includes a transistor T24. A first terminal and a control terminal of the transistor T24 are coupled to the previous two stage of the driving signal ST[n−2], and a second terminal of the transistor T24 is coupled to the internal terminal Nix. Specifically, when the previous two stage of the driving signal ST[n−2] is high-level, the terminal voltage Q[n] is raised. When the previous two stage of the driving signal ST[n−2] is low-level, the terminal voltage Q[n] is irrelevant to the previous two stage of the driving signal ST[n−2].

In the present embodiment, the first control unit 140b of the shift register 300 includes transistors T25 to T29. A first terminal of the transistor T25 is coupled to the first control signal K[n], a control terminal of the transistor T25 receives the previous two stage of the driving signal ST[n−2], and a second terminal of the transistor T25 receives the first low voltage VSS0. When the previous two stages of the driving signal ST[n−2] is high-level, the first control signal K[n] is lowered due to influence of the first low voltage VSS0. When the previous two stages of the driving signal ST[n−2] is low-level, the first control signal K[n] is irrelevant to the first low voltage VSS0. A first terminal of the transistor T26 receives the clock signal HC1, and a control terminal of the transistor T26 is coupled to the first terminal of the transistor T26. In other words, the first terminal and the control terminal of the transistor T26 respectively receive the clock signal HC1. A first terminal of the transistor T27 is coupled to a second terminal of the transistor T26, a control terminal of the transistor T27 receives the current stage of the driving signal ST[n], and a second terminal of the transistor T27 receives a second low voltage VSS1. A first terminal of the transistor T28 receives the clock signal HC1, a control terminal of the transistor T28 is coupled to the second terminal of the transistor T26, and a second terminal of the transistor T28 provides the first control signal K[n]. A first terminal of the transistor T29 is coupled to the second terminal of the transistor T28, a control terminal of the transistor T29 receives the current stage of the driving signal ST[n], and a second terminal of the transistor T29 receives the second low voltage VSS1.

In the present embodiment, the discharge unit 130b of the shift register 300 includes transistors T30 to T37. A first terminal of the transistor T30 is coupled to the internal terminal Nix, a control terminal of the transistor T30 receives the first control signal K[n], and a second terminal of the transistor T30 receives the first low voltage VSS0. A first terminal of the transistor T31 receives the current stage of the gate signal G[n], a control terminal of the transistor T31 receives the first control signal K[n], and a second terminal of the transistor T31 receives the second low voltage VSS1. A first terminal of the transistor T32 receives the current stage of the driving signal ST[n], a control terminal of the transistor T32 receives the first control signal K[n], and a second terminal of the transistor T32 receives the first low voltage VSS0.

When the first control signal K[n] is high-level, the transistors T30 to T32 are simultaneously switched on to respectively lower the terminal voltage Q[n], the current stage of the gate signal G[n], and the current stage of the driving signal ST[n] by the first low voltage VSS0 and the second low voltage VSS1. When the first control signal K[n] is low-level, the transistors T30 to T32 are cut off (not switched on), and at this time, the levels of the terminal voltage Q[n], the current stage of the gate signal G[n], and the current stage of the driving signal ST[n] are irrelevant to the first low voltage VSS0 and the second low voltage VSS1.

In the discharge unit 130b, a first terminal of the transistor T33 is coupled to the internal terminal Nix, a control terminal of the transistor T33 receives a next four stages of the driving signal ST[n+4], and a second terminal of the transistor T33 receives the first low voltage VSS0. When the next four stages of the driving signal ST[n+4] is high-level, the transistor T33 is switched on to lower the terminal voltage Q[n] by the first low voltage VSS0. When the next four stages of the driving signal ST[n+4] is low-level, the transistor T33 is cut off (not switched on), and the terminal voltage Q[n] is irrelevant to the first low voltage VSS0.

A first terminal of the transistor T34 is coupled to the internal terminal Nix, and a control terminal of the transistor T34 receives the next two stages of the driving signal ST[n+2]. A first terminal and a control terminal of the transistor T35 are coupled to a second terminal of the transistor T34, and a second terminal of the transistor T35 receives the first low voltage VSS0. Moreover, a first terminal of the transistor T36 receives the current stage of the driving signal ST[n], a control terminal of the transistor T36 receives the next two stages of the driving signal ST[n+2], and a second terminal of the transistor T36 receives the first low voltage VSS0. A first terminal of the transistor T37 receives the current stage of the gate signal G[n], a control terminal of the transistor T37 receives the next two stages of the driving signal ST[n+2], and a second terminal of the transistor T37 receives the second low voltage VSS1.

When the next two stages of the driving signal ST[n+2] is high-level, the transistors T34 to T37 are simultaneously switched on to respectively lower the terminal voltage Q[n], the current stage of the gate signal G[n], and the current stage of the driving signal ST[n] by the first low voltage VSS0 and the second low voltage VSS1. When the next two stages of the driving signal ST[n+2] is low-level, the transistors T34 to T37 are cut off (not switched on), and at this time, the levels of the terminal voltage Q[n], the current stage of the gate signal G[n], and the current stage of the driving signal ST[n] are irrelevant to the first low voltage VSS0 and the second low voltage VSS1.

In the embodiment of FIG. 3, the second low voltage VSS1 is different from the first low voltage VSS0. For example, the second low voltage VSS1 is smaller than the first low voltage VSS0, which is determined according to the circuit design and does not limit the present embodiment of the invention. In addition, a plurality of low voltages of different voltage levels are provided such that part of the transistors can still normally operate when the transistors have negative threshold voltage is avoided.

Figure 4:
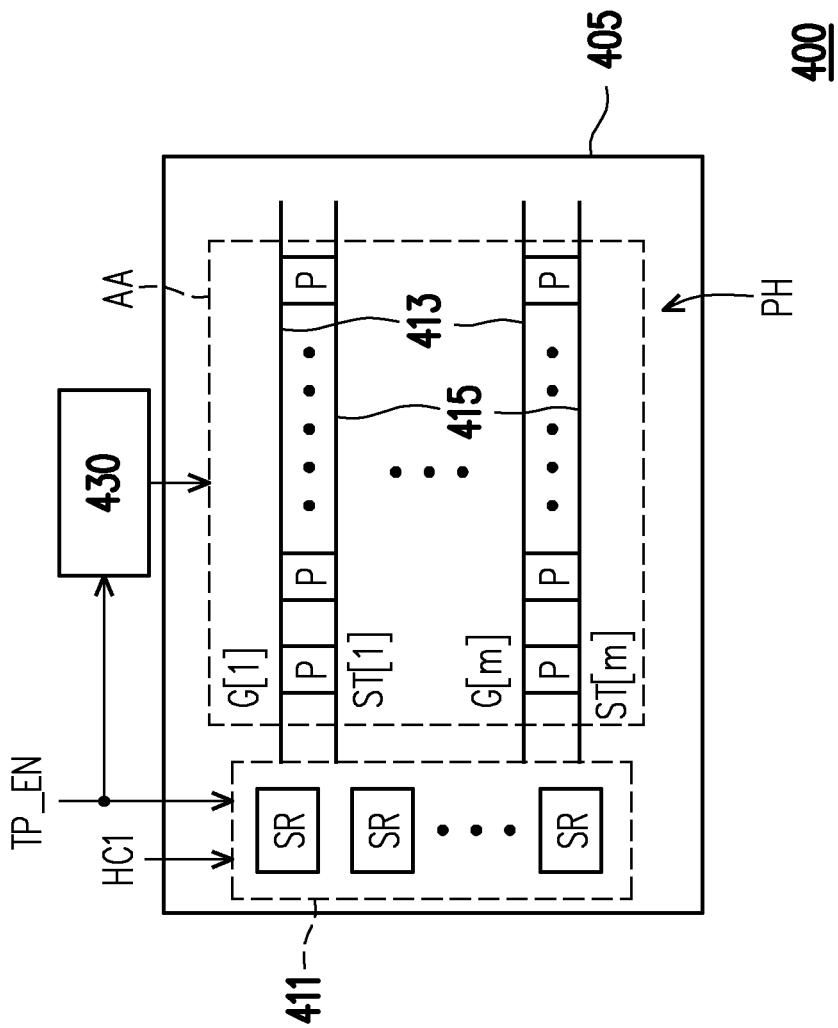
FIG. 4 is a schematic diagram illustrating a system of a touch display apparatus according to an embodiment of the invention.

FIG. 4 is a schematic diagram illustrating a system of a touch display apparatus according to an embodiment of the invention. Referring to FIG. 4, in the present embodiment, a touch display apparatus 400 includes a touch display panel 405 and a data driving circuit 430, wherein the touch display panel 405 includes a display panel 410, a touch layer (not illustrated), and a gate circuit 411. The display panel 410 includes an active region AA and a peripheral region PH. The touch layer is disposed in the active region AA, and the gate circuit 411 is disposed in the peripheral region PH. In the present embodiment, the display panel 410 also includes a plurality of pixels P, a plurality of gate lines 413, and a plurality of driving lines 415, wherein the plurality of pixels P are located in the active region AA and are used for image displaying and touch sensing, and the plurality of pixels P are arranged in patterns such as arrays, honeycombs and so on to present different resolutions of images and sensing, but the invention is not limited hereto. The gate circuit 411 includes a shift register SR of multiple stages. The shift register SR in each stage outputs a current stage of gate signal (e.g., G[1] to G[m]) and a driving signal (e.g., ST[1] to ST[m]), which are transmitted among the pixels P via the gate lines 413 and the driving lines 415. In the present embodiment, reference is made to the shift registers 100, 200, and 300 illustrated in FIG. 1 to FIG. 3 for the shift register SR.

Specifically, the shift register SR receives a touch enable signal TP_EN and a clock signal HC1 and further outputs the corresponding gate signal and driving signal, e.g., the gate signals G[1] to G[m] and the driving signals ST[1] to ST[m], wherein m is a positive integer. In the present embodiment, the data driving circuit 430 is located in the peripheral region PH and is coupled to each of the pixels P. When the touch display apparatus 400 is in a display mode, the pixels P are activated through the gate circuit 411, and the data driving circuit 430 inputs pixel data into the pixels P to further display the images. When the touch display apparatus 400 is in a touch mode, the touch enable signal TP_EN enables the gate circuit 411 and the data driving circuit 430 respectively to further cause the pixels P to sense a touch signal. In the gate circuit 411 of the present embodiment, the shift register SR includes a first compensation transistor TC1 and a second compensation transistor TC2, and the first compensation transistor TC1 and the second compensation transistor TC2 both receive the touch enable signal TP_EN. Accordingly, in the touch mode, due to the enablement by the touch enable signal TP_EN (for example, the touch enable signal TP_EN is high-level), a terminal voltage Q of the shift register SR can constantly remain in a charging state. Therefore, when entering the display mode, errors or current leakage of the gate signal G[n] outputted by the shift register SR can be avoided to ensure that the touch display apparatus 400 can properly display the images. In the present embodiment, the touch enable signal TP_EN is provided by a control circuit such as a timing controller. In the embodiment of FIG. 4, the gate circuit 411 is located on a single side of the active region AA, i.e., single side driving. However, the invention is not limited hereto and may be arranged according to different driving needs. For example, the gate circuit 411 is located on two opposite sides of the active region, forming dual side driving.

In summary of the above, in the shift register and the touch display apparatus thereof of the embodiments of the invention, when the touch display panel is scanning, the first compensation transistor and the second compensation transistor are switched on to charge the terminal voltage. Thereby, decay of the terminal voltage resulting from passing of time is prevented, and failure of normal operation is further prevented.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A shift register comprising:
a voltage setting circuit, receiving a first gate reference signal to set a terminal voltage of an internal terminal;
a driving circuit, coupled to the internal terminal and receiving the terminal voltage and a clock signal to provide a gate signal and a driving signal;
a first control circuit, coupled to the internal terminal and receiving a first low-frequency clock signal, the terminal voltage, and a low voltage to provide a first control signal;
a discharge circuit, coupled to the first control circuit to receive the first control signal and discharging the terminal voltage and the gate signal according to the first control signal;
a first compensation transistor, comprising a first terminal, a control terminal, and a second terminal, wherein the first terminal receives a touch enable signal, and the control terminal is coupled to the internal terminal; and
a second compensation transistor, comprising a first terminal, a control terminal, and a second terminal, wherein the first terminal is coupled to the second terminal of the first compensation transistor, the control terminal receives the touch enable signal, and the second terminal is coupled to the internal terminal,
wherein the touch enable signal is passed to the internal terminal through the switched-on first compensation transistor and the switched-on second compensation transistor.

2. The shift register according to claim 1, wherein the driving circuit comprises:
a first drive transistor, comprising a first terminal, a control terminal, and a second terminal, wherein the first terminal receives the clock signal, the control terminal receives the terminal voltage, and the second terminal provides the gate signal; and
a second drive transistor, comprising a first terminal, a control terminal, and a second terminal, wherein the first terminal receives the clock signal, the control terminal receives the terminal voltage, and the second terminal provides the driving signal.

3. The shift register according to claim 1, wherein the voltage setting circuit comprises:
a first transistor, comprising a first terminal, a control terminal, and a second terminal, wherein the first terminal receives the first gate reference signal, and the control terminal receives a first driving reference signal;
a second transistor, comprising a first terminal, a control terminal, and a second terminal, wherein the first terminal is coupled to the second terminal of the first transistor, the control terminal receives the first driving reference signal, and the second terminal is coupled to the internal terminal; and
a third transistor, comprising a first terminal, a control terminal, and a second terminal, wherein the first terminal receives the second terminal of the first transistor, and the control terminal and the second terminal receive the touch enable signal.

4. The shift register according to claim 1, wherein the discharge circuit comprises:
a fourth transistor, comprising a first terminal, a control terminal, and a second terminal, wherein the first terminal is coupled to the internal terminal, the control terminal receives the first control signal, and the second terminal receives the driving signal;

a fifth transistor, comprising a first terminal, a control terminal, and a second terminal, wherein the first terminal receives the driving signal, the control terminal receives the first control signal, and the second terminal receives the low voltage; and a sixth transistor, comprising a first terminal, a control terminal, and a second terminal, wherein the first terminal receives the gate signal, the control terminal receives the first control signal, and the second terminal receives the low voltage.

5. The shift register according to claim 4, wherein the discharge circuit further comprises:

a seventh transistor, comprising a first terminal, a control terminal, and a second terminal, wherein the first terminal is coupled to the internal terminal, and the control terminal receives a second driving reference signal;

an eighth transistor, comprising a first terminal, a control terminal, and a second terminal, wherein the first terminal receives the second terminal of the seventh transistor, the control terminal receives the second driving reference signal, and the second terminal receives the low voltage;

a ninth transistor, comprising a first terminal, a control terminal, and a second terminal, wherein the first terminal is coupled to the second terminal of the seventh transistor, and the control terminal and the second terminal receive the touch enable signal; and a tenth transistor, comprising a first terminal, a control terminal, and a second terminal, wherein the first terminal receives the gate signal, the control terminal receives the second driving reference signal, and the second terminal receives the low voltage.

6. The shift register according to claim 5, wherein the discharge circuit further comprises:

an eleventh transistor, comprising a first terminal, a control terminal, and a second terminal, wherein the first terminal receives the gate signal, the control terminal receives the touch enable signal, and the second terminal receives the low voltage; and a twelfth transistor, comprising a first terminal, a control terminal, and a second terminal, wherein the first terminal receives the driving signal, the control terminal receives the touch enable signal, and the second terminal receives the low voltage.

7. The shift register according to claim 1, further comprising a second control circuit, wherein the second control circuit is coupled to the internal terminal and receiving a second low-frequency clock signal, the terminal voltage, and the low voltage to provide a second control signal.

8. The shift register according to claim 7, wherein the second low-frequency clock signal is an inverted signal of the first low-frequency clock signal.

9. A touch display apparatus comprising:

a display panel, comprising an active region and a peripheral region;

a touch layer, located in the active region; and a multiple stage of the shift register, located in the peripheral region and coupled to the display panel, wherein each stage of the shift register receives a touch enable signal and a first clock signal and outputs a current stage of gate signal and a current stage of the driving signal, each stage of the shift register further comprising:

a voltage setting circuit, respectively coupled to a previous two stages of the gate signal and a previous two stages of the driving signal;

a driving circuit, coupled to the first clock signal and outputting the current stage of the gate signal and the current stage of the driving signal, wherein the voltage setting circuit and the driving circuit are coupled to each other via an internal terminal;

a control circuit, coupled to the internal terminal and outputting a control signal;

a discharge circuit, respectively coupled to the internal terminal, the control circuit, and the driving circuit and receiving the control signal;

a first compensation transistor, comprising a first a control terminal, and a second terminal, wherein the first terminal is coupled to the touch enable signal, and the control terminal is coupled to the internal terminal; and a second compensation transistor, comprising a first terminal, a control terminal, and a second terminal, wherein the first terminal is coupled to the second terminal of the first compensation transistor, the control terminal is coupled to the touch enable signal, and the second terminal is coupled to the internal terminal, wherein the touch enable signal is passed to the internal terminal through the switched-on first compensation transistor and the switched-on second compensation transistor.

10. The touch display apparatus according to claim 9, wherein the voltage setting circuit comprises:

a first transistor, comprising a first terminal, a second terminal, and a control terminal, wherein the first terminal is coupled to the previous two stages of the gate signal, and the control terminal is coupled to the previous two stages of the driving signal;

a second transistor, comprising a first terminal, a second terminal, and a control terminal, wherein the first terminal is coupled to the second terminal of the first transistor, the second terminal is coupled to the internal terminal, and the control terminal is coupled to the previous two stages of the driving signal; and a third transistor, comprising a first terminal, a second terminal, and a control terminal, wherein the first terminal is coupled to the second terminal of the first transistor, and the second terminal and the control terminal are respectively coupled to the touch enable signal.

* * * * *